3,160,520

METHOD FOR COATING P-N JUNCTION DEVICES WITH AN ELECTROPOSITIVE EXHIBITING MATERIAL AND ARTICLE

Ottomar Jäntsch and Barbara Matil, Munich, Germany, assignors to Siemens-Schuckertwerke Aktiengesellschaft, Berlin-Siemensstadt, Germany, a corporation of Germany Filed Jan. 25, 1961, Ser. No. 84,812
Claims priority, application Germany, Apr. 30, 1960, S 68,299
19 Claims. (Cl. 117—201)

Our invention relates to the manufacture of electric semiconductor devices having one or more p-n junctions, such as junction rectifiers, transistors, photoelectric cells, silicon controlled rectifiers or other semiconductor devices of thyratron-like switching performance.

Such devices, as a rule, are produced by doping the originally available crystalline silicon or other semiconductor body with acceptor or donor substances in order to obtain the desired p-n junction or junctions. In many cases the semiconductor body, used as starting material to be provided with electrodes and doping substances by diffusion or alloying, already possesses slight p-type conductance. This, for example, applies to the silicon wafers generally employed for producing such junction devices.

With such slightly extrinsic p-type semiconductors, the blocking characteristic of an individual p-n junction has been found to be subject to detrimental aging. That is, the curve of inverse current versus inverse voltage, for example in a rectifier, is apt to change its configuration toward a less advantageous shape than originally obtained. For example, after prolonged heating of the semiconductor device, for instance at temperatures of the order of about 100° C. or more, which heating may occur during normal operation, the increase in inverse current exhibits a higher rate and commences at a lower inverse voltage, often at a fairly pronounced knee in the curve, than was originally the case.

It had been suspected that such deterioration is due to effects occurring at the location where the p-n junction emerges at the surface of the semiconductor body. However, the deterioration could not be prevented by covering this surface location with a protective coating of varnish, for example impurity-free silicone resin.

It is an object of our invention, therefore, to reliably eliminate the above-mentioned deficiency and thus to provide junction-type semiconductor devices of improved and stable blocking performance and increased useful life.

We have discovered that the above-described detrimental phenomena found in semiconductor devices having an originally slightly p-conducting semiconductor substance, can be eliminated by applying to the p-n junction at the semiconductor surface a protective coating of electrically insulating material, for example insulating varnish of the usual kind, if this varnish, prior to its deposition, is provided with an addition of alizarin. Alizarin is also an electrical insulator and, in chemical nomenclature, is dioxyanthraquinone. Based upon the discovery that addition of alizarin eliminates or compensates the change in electric characteristic otherwise caused by heating, we arrived at the following conclusion.

The particular aging phenomena observed, namely the shifting of the blocking characteristic at low voltages (below the knee) toward lower inverse currents, in conjunction with the commencement of the steeper current increase (knee) toward lower values of inverse voltage, is an indication of the fact that electronegative charges have become active at the surface of the p-n junction. This can be explained on the theory that a layer or skin of electronegative character is normally present on the surface of the semiconductor, for example the said weakly p-type silicon, the electronegative skin being formed presumably by an oxide of the silicon or other semiconductor substance.

The shift of the blocking characteristic below the knee toward lower values of inverse currents as a result of the electronegative charges, can be understood from the fact that an electronegative charge raises the energy bands toward the surface of the semiconductor body. In conjunction therewith there occurs a reduction in the rate of surface recombination of the charge carriers. This is tantamount to lowering the inverse-current level, a phenomenon particularly significant for small values of inverse voltage, such as below 1 volt. The shifting of the blocking characteristic in the sense that the knee and the steeper increase of inverse current occur already at smaller inverse voltage, this being also due to the electronegative charges, means that the space-charge region becomes smaller so that impact ionization and hence voltage breakdown commence already at lower voltage values.

It followed from our foregoing concepts that, since an addition of alizarin compensates the otherwise occurring deterioration of the inverse-current characteristic, the electropositive character of alizarin relative to the semiconductor substance is responsible for the elimination of the electro-negative effect at the surface of the p-n junction, and that any other suitable electropositive coating on the p-n junction surface of an initially p-type semiconductor crystal will also prevent such deterioration. We have found this confirmed by comprehensive further investigation.

Thus the above-reported discovery and conceptions have led to the broader feature of our invention, according to which a temperature-dependent deterioration of the blocking characteristic of a p-n junction in a semiconductor device is avoided by providing the p-n junction at the surface of the semiconductor body with a coating of an electrically insulating substance, for example varnish, which is active electropositively either by inherently containing an electropositive ingredient or by being provided with an additive to provide electropositive action relative to the semiconductor surface.

However, the property of electropositive behavior as such is not sufficient to maintain the p-n junction semiconductor device operative in the desired sense. For example, such substances as water or alcohol, for example ethyl alcohol, are electropositive. But when the insulating protecting coating at the p-n junction surface is given an addition of water or alcohol, the device is not suitable for use at the normal operating temperatures, which as a rule, are considerably above the boiling point of water or alcohol. The addition substance or the coating of electropositive behavior must be sufficiently stable and must remain adsorbed in order to permanently perform the above-described function.

Consequently, the electrically insulating coating substance, or at least the constituent of the coating originally contained therein or admixed thereto for obtaining electropositive action at the p-n junction surface, must possess such a low vapor pressure that this constituent or additional substance at the rectifying p-n junction is stable and remains absorbed at the temperatures used for processing the semiconductor device during manufacture and occurring during the normal operation of the completed device.

While the invention is most advantageous for p-n junction semiconductor devices in which the basic semiconductor body has p-type conductance, it is in principle, also applicable, advantageously, when using as starting body for the production of the semiconductor device a substance of slight n-type conductance. Aside from the above-mentioned p-type silicon the semiconductor body may consist of p-type germanium, or of a semiconductor having the character of a p-type or p-doped plural-substance compound, for example a binary compound of the type $A_{III}B_V$ formed of an element from the third group and an element of the fifth group of the periodic system, as known from U.S. Patent 2,798,989 of H. Welker. Corresponding n-type materials are also applicable for the purposes of the invention as long as the n-type conductance is not excessively pronounced.

The invention will be further described with reference to the drawings in which.

Figure 1:
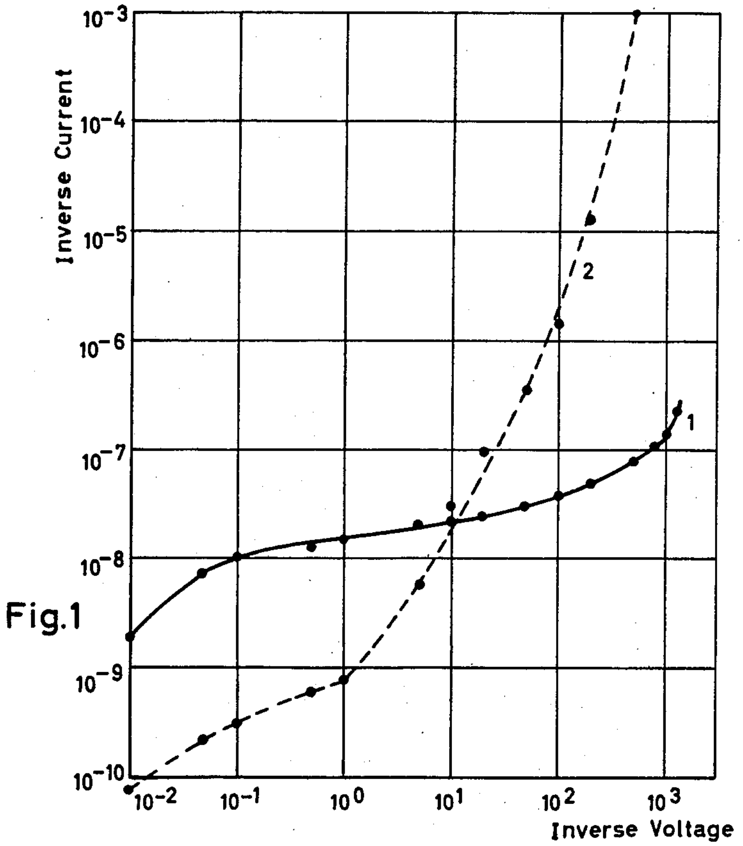
FIG. 1 is a graph of the blocking characteristic of a semiconductor p-n junction.

On the coordinate diagram of FIG. 1 graphs are presented of two current characteristics, denoted by 1 and 2. The abscissa denotes the inverse voltage applied to the rectifier. The resulting inverse currents are on the ordinates. Logarithmic scales are used for both abscissa and ordinate. The data for characteristic 1 were determined upon a silicon rectifier element made by the alloying process, from an originally p-type high-ohmic semiconductor body. The determinations were made after completion of the rectifier, but before subjecting it to any heat treatment. The rectifier element was then heated in a dry atmosphere for about 20 hours at 180° C. Thereafter the element was permitted to cool to normal room temperature (20° C.). The same measurements as before were carried out, to obtain the characteristic 2. The latter evidences the above-described detrimental phenomenon, namely the fact that, due to the effect of prolonged heating, the characteristic is shifted to smaller inverse currents in the range of small inverse voltages, but is shifted toward higher currents at higher inverse voltages. This shift and the greater rate of current increase commence at a much lower inverse voltage than originally.

Other rectifier elements identical with those described above were provided with a varnish coating containing an addition of alizarin at the p-n junction, before subjecting the rectifier element to heat treatment. It was found that when employing the same heat treatment as described above with reference to characteristic 2 in FIG. 1, virtually the original blocking characteristic 1 was preserved. Used in these investigations as protective coating was a commercial silicone varnish to which approximately 20% by weight of alizarin was admixed. Alizarin melts at 290° C., and boils at 430° C. Other protective coatings and varnishes having sufficiently electrically insulating properties produced the same qualitative improvement.

The invention therefore provides improved rectifiers or other semiconductor devices utilizable at increased operating temperatures and increased inverse voltages. This is accomplished without endangering the desired satisfactory performance, and at temperatures and voltages much higher than heretofore permissible.

For some applications of junction semiconductor devices, it is not only desirable that they preserve a stable operating characteristic over a very large temperature range, ranging above and below normal ambient or room temperature, but that the electrically insulating protective layer or varnish coating possess sufficient mechanical stability. Such mechanical stability must be sufficiently great to prevent divergent temperaure coefficients of expansion of the semiconductor body, or of the electrodes and the protective coating, from causing the coating to scale off or crack. The prevention of scaling requires using for the protective coating a substance which has good wetting action and good adhesive action with respect to the semiconductor body and its electrodes.

Further improvement of the above-described fundamental method of the invention can be obtained by using a protective coating or varnish at the p-n junction of the semiconductor device comprising a combination or composition of silicone resin and terephthalic ester resin together, or a composition of silicone resin and a phenolic resin, each in a mixture of organic solvents. As solvent mixture in the former case, cyclohexanone with toluol may be used for example. In the latter case, xylol with cyclohexanone may be used.

A suitable composition of silicone resin and terephthalic ester resin is the following mixture:

40% by weight of phenyl-methyl-polysiloxane resin and 10% by weight terephthalic ester resin are dissolved in 50% by weight of cyclohexanone, namely an aliphatic ketone. The terephthalic resin may be an ester of terephthalic acid and an aliphatic glycol, such as ethylene-glycol, propylene-glycol or butylene-glycol. This composition is available in the trade from Wacker, Munich, Germany, under the trade designation "CL1."

The following composition of silicone resin and phenyl resin can be used:

39% by weight phenyl-methyl-polysiloxane resin and 21% by weight phenol-formaldehyde resin, dissolved in 40% by weight of xylol. This composition is available in the trade from Wacker, Munich, Germany, under the designation "CL6."

The resins are typical comparatively low molecular weight varnish resins, and are of sufficiently high molecular weight so as to have no appreciable vapor pressure at 20° C. The silicone resin is of the methylpolysiloxane or methylphenylpolysiloxane type, is hydrocarbon soluble and thermosetting and may be commercially obtained from Dow-Corning under the trade name DC801.

To each of these compositions, can then be added the above-mentioned addition substance, for example alizarin, which when the coating is placed upon the p-n surface area and the vicinity thereof, becomes electropositively active, and due to its low vaporization temperature has sufficient stability during manufacture of the semiconductor device and its subsequent operation. The production of a semiconductor device according to the invention, in the manner just described, may proceed as follows. First, the semiconductor element, including its p-n junction is completed. Then the surface area of the semiconductor body where the p-n junction emerges, and the vicinity thereof are coated with one of the above-mentioned combination substances. This is done by brushing the resinous substance onto the surface or spraying it thereupon. This substance is then cured by heat-treatment at about 200° C. for a period of about 10 to 15 hours, whereby it becomes hardened.

Tests were made with semiconductor devices produced in this manner, including diodes for high voltages, such as 1500 volts or more. These semiconductor devices remained in good condition mechanically as well as electrically at low temperatures, of the order of about −60 to −80° C., as well as at temperatures up to about +250° C. Within this wide temperature range, the coatings remained free of cracks, and the varnish coating remained reliably adherent to the semiconductor body. The reverse-current versus reverse-voltage characteristic remained virtually preserved, so that the electrical properties of the device also remained unchanged. That is, only slight and negligible variations of the current-voltage characteristic were observable, the area of steep current increase being displaced toward lower voltage values only to a negligible extent, the magnitude of the reverse-current being virtually preserved at approximately the original level.

Comprehensive tests have also shown, as already indicated above, that when suitable compositions of the above-mentioned kind are used for coating purposes, the admixture of an electropositive addition substance to the particular composition is not necessarily required. This phenomenon can be explained physically by the fact that the above-mentioned combinations of substances, used as coating compositions, have already inherently and to some extent the character of electropositive action when deposited upon the p-n junction on the surface of the semiconductor body. The apparent cause of this favorable effect is the fact that the mentioned coating compositions contain a bonded constituent, having the electropositive action, the bonding being such that these active constituents do not evaporate out of the combination of substances in the desired range of temperatures mentioned above, so that the combination substance remains permanently stable with respect to the desired preservation of electrical properties.

On the other hand, these compositions, when in solution, have also been found to be well suited for the reception of adidtional electropositive substance. For example, when alizarin is added to the solution, it was found to be readily dissolvable therein, so that when thereafter the solvent is evaporated out of the composition the alizarin remains to a great extent homogeneously distributed in the protective coating for the p-n junction.

Figure 2:
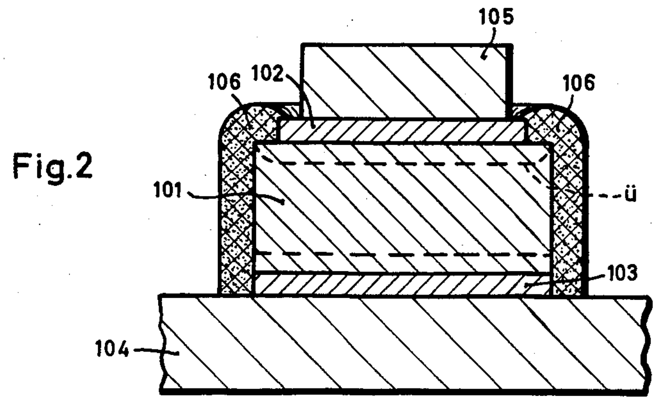
FIG. 2 shows in section a junction rectifier according to the invention.

A rectifier according to the invention will now be described with reference to FIG. 2, showing the device in section on enlarged scale. The device comprises a semiconductor body 101 of slightly p-conducting silicon. Joined with the semiconductor body are two electrodes 102 and 103, the junction being effected by alloying the electrodes into the semiconductor surface zones. The electrode 102 may consist of a gold-antimony alloy with about 1% antimony. The electrode 103 may consist of aluminum. Due to the doping of the aluminum of the electrode 103, a more strongly p-conducting zone is developed adjacent to that electrode. The upper boundary of this strongly p-conducting zone is indicated by the lower dotted line. Due to the doping action of the antimony in electrode 102, an upper n-type zone is formed, thus producing a p-n- junction in the semiconductor body at upper dotted line *u*. Simultaneously with the alloying operation for bonding the electrodes 102 and 103 to the semiconductor body and producing the correspondingly doped regions, two plates 104 and 105, consisting for example of molybdenum, tungsten or tantalum, are joined with the electrodes by alloying or soldering.

In accordance with the present invention, protection is to be afforded at the surface locations where the p-n junction *u* appears, this junction being located in the vicinity of the gold-antimony electrode 102, so that the protection is to be afforded along the peripheral marginal zone adjacent to the electrode 102. Now, according to the invention this surface zone near the p-n junction *u* on the semiconductor body 101 is covered by a coating 106 consisting of one of the above-mentioned combinations or compositions. Such composition is applied in dissolved condition to the proper areas by brushing or spraying, the other surface areas of the device being masked off. Thereafter, the coating is cured by heating the device, to harden the coating. The device thus completed can be provided with additional electric terminal bodies, and cooling vanes or other heat sinks, for example of copper, which are joined with the plates 104 and 105 by soldering or, if desired, by alloying the terminal bodies or heat sinks together with the plates, simultaneously with the above-described production of the alloy-bond between the electrodes and the semiconductor proper. The semiconductor device, thus finished, can then be sealed in a metallic housing or capsule, with insulating seals through which the electric connecting leads pass to the outside. In this manner, the entire semiconductor device proper is protected from detrimental ambient influences.

While the above-described embodiment relates to a semiconductor with a single p-n junction, the invention is advantageously applicable in the same manner to semiconductor devices having a plurality of p-n junctions, as is the case with transistors or other triodes, or silicon-controlled rectifiers or other switching or gating devices. In such cases, each of the individual p-n junctions may be provided with a protective coating according to the invention. In some cases, however, the desired operation of the semiconductor device may make it advisable not to treat all of the p-n junctions in the above-described manner, but to treat only one or a given number among the totality of such junctions. That is, only selected ones of the p-n junctions in a single device may be provided with an insulating varnish or other coating which inherently acts electropositively after deposit upon the p-n junction, or which assumes electropositive action due to a special addition such as alizarin, whereas a different protective expedient or treatment is employed at one or more other junctions of the same device. This is particularly applicable, for example, with power transistors of great power-carrying capacity which, accordingly, have p-n junctions of relatively great area.

With such a large-area transistor it is desirable that the impact ionization commence at high voltage values, in the vicinity of the one p-n junction located in the base-collector region of the transistor. However, at the same time it may be desirable to reduce the blocking-current level in the emitter-base junction region of the transistor in order to obtain an increased current-amplification factor. The latter can be obtained by subjecting the particular portion of the semiconductor to a treatment which reduces the surface re-combination rate at this particular p-n junction. To explain how this effect is achieved, reference will now be made to the explanatory graph shown in FIG. 3 of the drawing.

Figure 3:
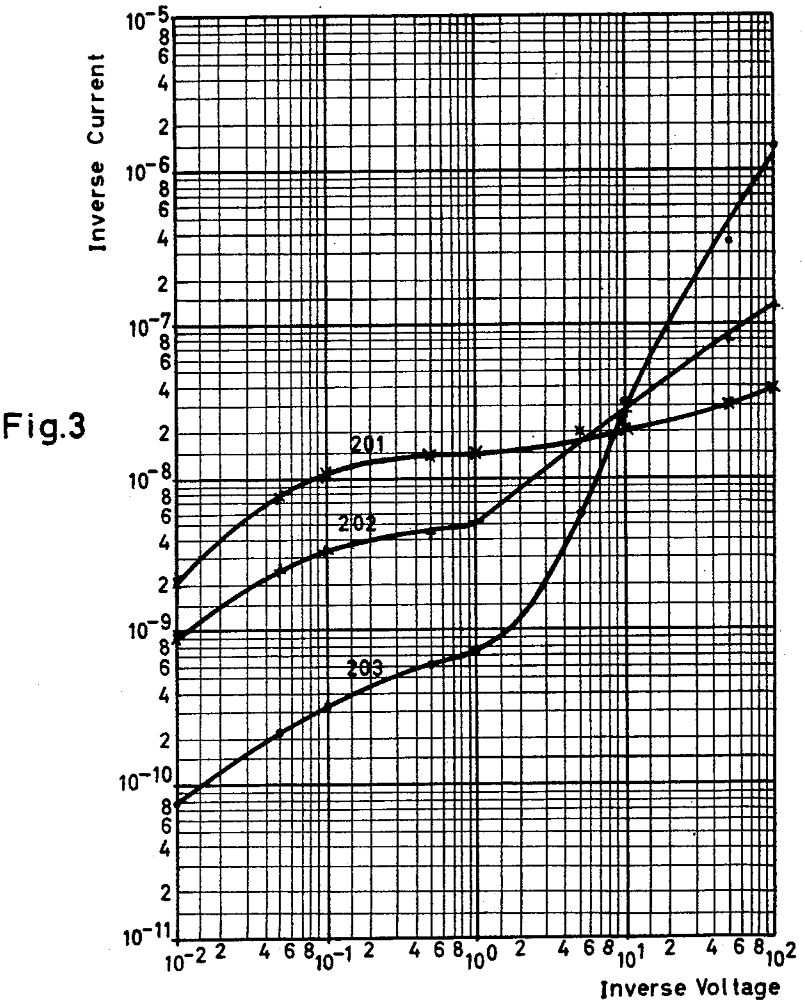
FIG. 3 is another explanatory graph of blocking characteristics.

In FIG. 3, the abscissa denotes inverse-voltage and the ordinate denotes inverse-current, both being on a logarithmic scale. FIG. 3 illustrates portions of the current characteristics relating to three alloyed p-$s_p$-n rectifiers whose base material consists of p-type silicon with a resistance of about 1000 ohm·cm. The symbol $s_p$ denotes slight acceptor-doping or p-type conductance. The characteristic denoted by 201 was obtained by observations upon such a rectifier after it was subjected to etching treatment in an acid mixture of fluoric acid and nitric acid, subsequent rinsing, and drying in nitrogen. Thereafter, the determinations were effected in dry nitrogen.

The characteristic 202 was obtained after the etched and dried rectifier was subjected for some time to ozone-containing oxygen, the measuring of the electric properties being carried out in this atmosphere. The comparison of the two curves 201 and 202 shows that the treatment with ozone-containing oxygen had the effect of considerably depressing the left-hand portion of characteristic 202 in the direction toward lower inverse-current values, as compared with the corresponding portion of the characteristic 201.

Ozone, or ozone-containing oxygen, are substances which, according to present knowledge, result in obtaining the greatest possible reduction in surface re-combination rate of extrinsic p-type semiconductors. However, ozone is not stable but tends to rapidly decompose. Consequently, such treatment of a semiconductor device with ozone or ozone-containing oxygen would not be sufficient to obtain a permanently stable reduced rate of surface re-combination in a semiconductor device, particularly a device containing a p-n junction.

According to another feature of our invention, we proceed as follows, in a differential treatment of one of the p-n junctions, to greatly reduce the rate of surface re-combination, and the inverse-current level at low values of inverse-voltage, while at the same time obtaining stable behavior of the device thus treated, during subsequent use.

For example, when processing the p-n junction between the emitter and base of a n-p-n transistor, we subject the semiconductor body to a temperature or tempering treatment at a temperature above normal room temperature in a dry atmosphere which may consist of nitrogen, oxygen or air, and we continue the treatment until the rate of surface re-combination of the p-type region in the semiconductor body, measured while the treatment is being performed, virtually ceased to show a further decline.

This method has the effect of imparting, to be treated p-n junction, a characteristic typified by curve 203 in FIG. 3. The data for this curve was obtained by measurements on a rectifier which had been etched, rinsed, dried, and subsequently tempered for about 20 hours at 180° C. in dry nitrogen. Curve 203 shows that, in comparison with the characteristic 201 and 202, a considerably further reduction in inverse-current is attainable in the range up to the knee region of the characteristic.

After the desired condition of reduced rate of surface re-combination is obtained in the above-described manner, we employ expedients according to further features of the invention, in order to stabilize this desired condition in the semiconductor device so as to make the device insensitive to any detrimental effects of ambient conditions, such as ingress of vapors or humid air to the particular surface area of the semiconductor body which is to preserve a reduced rate of surface re-combination. For obtaining such stability, we proceed as follows. Subsequent to the above-mentioned temperature treatment, we encapsule or cover the semiconductor body, at least at the particular location where the device is to preserve the reduced rate of surface re-combination. If desired, however, the semiconductor body may also be encapsuled in totality, to attain the same permanent protection.

According to a further feature of our invention, such stabilization of the favorable condition produced in the semiconductor device can be further improved by coating the particular location of the semiconductor body with a protective layer. This coating may consist, for example, of a resin or grease, such as silicone resin or silicone grease or lubricant, preferably silicone high-vacuum grease, as commercially advisable, having no electropositive action after being placed upon the p-n junction area. Such coatings, as a rule, exhibit a degree of porosity. In such case, it is sometimes preferable to apply the latter protective coating not after the processing of the semiconductor body is finished, but preferably before or during the thermal treatment of the semiconductor body. This is preferable because, if the protective coating is porous, any undesired substances on or in the surface zone of the semiconductor can then diffuse to the outside through the protective coating while the thermal treatment is being performed.

The mode of processing just described is based upon the consideration that the novel technological effect attained by the thermal processing method of the invention can be explained by assuming that during the temperature treatment some substances are eliminated from the surface of the semiconductor body, which substances previously caused an electrical compensating effect with respect to the character of the electric charges at the surface of the semiconductor body, which compensating effect can be eliminated by the temperature treatment. For example, when processing a semiconductor body of silicon the oxide coating normally present at the surface may cause an electronegative charge which, however, is electrically compensated by ingress of water stemming either from vapor in the atmosphere and/or the etching treatment. In this condition, the semiconductor surface then exhibits neutral behavior, and a displacement of the energy bands in the semiconductor near its surface cannot take place. On this theory, and since the temperature treatment eliminates water from the surface zone of the semiconductor body, it will be understood that if the protective coating is porous, the water can diffuse through the pores to the outside.

The protective coating placed upon the above-designated area of the semiconductor surface is preferably either electrically neutral or electrically negative, and should also be chemically inert with respect to the semiconductor substance. The reduction in rate of surface recombination, particularly in the high-ohmic portion of a p-n junction semiconductor, for example a junction rectifier or junction transistor, has the effect, already explained, namely that the inverse-current characteristic is depressed in the region of the characteristic prior to commencement of impact ionization, i.e., before the characteristic passes into its steep portion, such depression of the characteristic having the result of reducing the inverse-current. This, for many purposes, is of special importance because it increases the asymmetry in conductance of the semiconductor device. However, such increase in asymmetrical conductance is attained in many cases only with respect to the region of the characteristic located in the range of low inverse-voltage ahead of the knee, where the characteristic assumes a greater rate of current increase. As a rule, and as also explained above, the decline in inverse-current is accompanied by the fact that the impact ionization commences at lower values of inverse voltage. This is apparent from the characteristics 202 and 203 in FIG. 3. In some cases, however, the phenomenon just described is not desired. If a junction rectifier or junction transistor, preferably with a p-type semiconductor body, is operated in such a manner that essentially only that portion of its characteristic is utilized which is located ahead of the critical point at which, due to the temperature treatment, the impact ionization commences at lower values of inverse-voltage—then the technological improvement afforded by virtue of the present invention is advantageously utilizable in the working range of the said p-n junction.

A variety of methods are available for securing this effect at a p-n junction, the inverse-current level of which is to be reduced. One of these is to provide the semiconductor body, prior to performing the thermal treatment, with a coating at those regions of the surface where a reduction of the amount of surface re-combination is not desired, the coating being such that the thermal treatment does not alter the behavior of the surface at these places, thus preventing the thermal treatment from having any effect at these places. Consequently, such regions can be masked off by one or more suitable coatings of varnish which act electropositively or which preferably contain an addition substance having electropositive action, for example, alizarin.

Another way is to first thermally treat the entire semiconductor body so that the surface re-combination is reduced at all locations of its surface. Thereafter, the other surface areas of the semiconductor body, where the reduced rate of re-combination is not desired, the coating of electrically insulating and electropositively acting substance, preferably with an electropositively acting addition, is deposited in one or more layers which again compensate the effect of the electronegative charges previously produced on the semiconductor surface.

A transistor whose two p-n junctions have been differently treated in accordance with the foregoing will be described presently with reference to FIG. 4.

The lower surface of the p-type silicon body 301 is provided with a collector electrode 302 consisting of gold-antimony. Located on the upper surface of the silicon body is a base electrode 303 consisting of aluminum and an emitter electrode 304 of gold-antimony. The emitter 304 is circular in shape, the base electrode 303 being ring-shaped. The electrodes 302, 303 and 304 are joined with the semiconductor body 301 by an alloying process carried out at about 700° C. During this process, the semiconductor zone adjacent to the collector 302 becomes doped and assumes n-type conductance, thus forming with the original silicon substance a p-n junction schematically indicated at 305. Analogously, the semiconductor zone adjacent to the emitter 304 becomes doped with antimony and assumes n-type conductance, so that another p-n junction is formed, as is schematically indicated at 306.

Upon completion of the alloying process, the semiconductor device is subjected to etching in a suitable etching solution, for example a mixture of nitric acid and fluoric acid. Thereafter the semiconductor device is rinsed and dried. According to the invention, a reduced rate of surface re-combination is to be obtained at the semiconductor surface at that location of the body where the p-n junction 306 emerges at the surface. For this purpose, the device is now placed into a furnace containing a dry atmosphere, for example nitrogen. In this furnace, the device is subjected to tempering at about 180° C. for a period of approximately 20 hours. All surface areas of p-type character on the surface of the semiconductor body are then pre-treated for a reduced rate of surface re-combination.

Thereafter, a varnish coating 307 is placed upon that surface area of the semiconductor body 301 located between the base electrode 303 and the emitter electrode 304, in order to make secure and to stabilize the previously reduced re-combination. This is preferably done directly in the furnace.

Furthermore, those surface areas of the semiconductor body 301 that are located between the outer periphery of the base electrode 303 and the collector electrode 302 are coated at 308 with an insulating varnish which contains an addition of alizarin. The latter acts to again compensate and eliminate the reduced surface re-combination at these surface areas. The coating 308 need not be applied inside the furnace.

As explained above, the varnish coating 308, which contains the compensating addition substance, may also be placed upon the semiconductor surface, at the proper area, prior to carrying out the tempering treatment employed to reduce surface re-combination between the two electrodes 303 and 304.

Although it is believed that the above description is sufficient to teach how to apply the invention, we provide the following specific examples, as preferred embodiments:

*Example I, for Producing a Semiconductor Element According to FIG. 2*

A base plate of Kovar-plated molybdenum, an electrode body 103 in form of an aluminum foil, a semiconductor body 101 of silicon weakly doped and of p-type conductance with about 1000 ohm·cm. specific resistance, and an electrode body 102 of a foil consisting of gold with an addition of antimony of about 3% are first individually cleaned by surface etching and are then piled upon each other in an auxiliary mold of graphite. Then the components are alloyed together in a furnace under vacuum at about 700 to 800° C. Thereafter the assembly is cooled and ultimately subjected to etching with a mixture of nitric acid and fluoric acid. Upon the alloying of the electrode 103 into the semiconductor body, there is formed in the semiconductor body 101 a more strongly doped zone, of the same electric conductance type as possessed by the body 101, this zone extending from the lower surface up to the lower broken line. Upon alloying the electrode 102 into the semiconductor body, there is formed a small n-doped zone in the body 101, extending from the upper surface of the semiconductor body 101 down to the broken line designated by *u*. Consequently, the broken line *u* denotes a p-n junction in the semiconductor body 101. The semiconductor element is then dried in a heated current of air on a hot plate at about 150° C. Thereafter, a brush is used to deposit the mixture of the above-mentioned varnish and, for example, an addition of about 20% alizarin, after both these substances have been intimately mixed by stirring with each other. The varnish is painted upon those places of the semiconductor body 101 in the electrode 102 which are indicated in FIG. 2 by the coating 106. The varnish coating is then hardened at about 200° C. for about fifteen hours. Thereafter, a terminal electrode 105, for example of copper, is soldered upon the upper electrode 102. The semiconductor element, thus completed, can now be encapsuled in a housing filled with protective gas, for example nitrogen.

Figure 4:
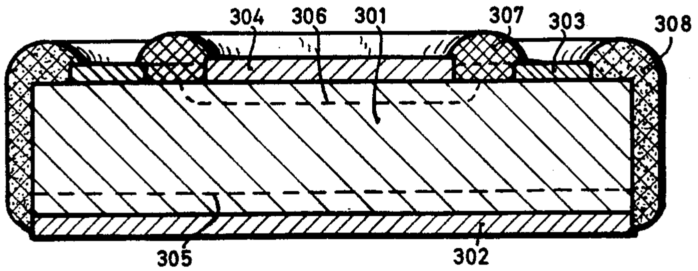
FIG. 4 is a sectional view of another semiconductor device according to the invention.

*Example II, for Producing a Semiconductor Element According to FIG. 4*

After purifying by etching, the following components are piled on top of each other in an auxiliary mold of graphite.

The collector electrode body 302 consisting of an alloy of gold and antimony; the semiconductor body 301 of silicon having a weak doping of p-type conductance type and a specific resistance of approximately 100 ohm·cm.; the emitter electrode body 304 of gold-antimony; the base electrode body 307 of antimony. This layered assembly is then subjected to an alloying process at the temperatures mentioned in Example I. As a result, there are obtained the two p-n junctions indicated by the broken lines 305 and 306 (FIG. 4). The semiconductor element thus produced is etched and dried. Thereafter, the coating denoted by 308 is painted upon the semiconductor body 301 between the two electrode bodies 303 and 302, in the above-mentioned manner. The coating consists of one of the described varnish mixtures containing an addition of alizarin. A varnish coating of a pure silicone varnish is placed upon the location denoted by the coating 307. The entire assembly is then tempered in a furnace at about 200° C. under a dry atmosphere, whereby the varnish coatings are hardened. This semiconductor element can be enclosed in a gas-filled capsule containing a dry atmosphere. The electric leads (not shown) for the semiconductor element pass out of the capsule so as to be accessible from the outside.

In addition to or in place of alizarin, we can employ purpurin (melts at 256° C.), or tetra-hydroxy-quinone, or fluorescein (melts at 312–8° C. with decomposition), which is resorcinolphthalein, having two phenolic hydroxy groups. Alizarin is employed in the coating composition preferably in a ratio equal to 20% by weight. The others are likewise preferably employed in a ratio of the same order of magnitude.

It is known that the molecules of water and of alcohol have relatively great dipole moments. These substances produce electropositive charges on silicon or germanium. It will be recognized from Table 1 on page 143 of the text by R. H. Kingston, "Semiconductor Surface Physics," Philadelphia, 1956, that these positive charges are appreciably effective electrically, rather than merely in respect to their dipole moments.

That in the subject matter of the present invention the alizarin has electropositive action is a conclusion which we have drawn from the results of tests made of the characteristics 1 and 2 illustrated in FIG. 1 of this application, and on the basis of the above-mentioned electropositive effects of water and alcohol on the surface of silicon semiconductors.

The semiconductor rectifier element, after being etched has the characteristic 1. When this element was heated in dry nitrogen at about 200° C. for about three days, there resulted the characteristic 2. If slight traces of humidity were permitted to enter into the dry space in which the semiconductor body was tempered and measured, the characteristic 1 again resulted. Upon again heating the semiconductor element, it is again converted into the condition according to characteristic 2. However, when a varnish with an alizarin addition was placed upon the semiconductor 2 with which the characteristic 2 was previously measured, then the characteristic 1 remained preserved even after subsequent heating of the semiconductor body.

This behavior is interpreted by assuming that the function of the humidity or water, which furnishes the characteristic 1 in the semiconductor body, is taken over by the alizarin after alizarin has been deposited.

This conclusion is all the more justified because a semiconductor element which at first possesses the characteristic 2 after tempering, can be converted back into the condition having characteristic 1 by subsequently providing the semiconductor body with a varnish layer having an addition of alizarin.

We claim:

1. A method of producing semiconductor devices having at least one p-n junction, such devices including rectifiers, transistors and controlled rectifiers, in which the p-n junction boundary emerges at a surface locality, the emergent boundary region being coated with an electrically insulating protective coating; the improvement characterized as follows: employing as said coating one which comprises a substance that causes the insulating material to be electro-positive, after being placed upon the semiconductor device, said substance having a vapor pressure sufficiently low to remain stable and remain adsorbed at temperatures that occur during further manufacturing steps and during subsequent operation of the semiconductor device.

2. The process of claim 1, said substance being one which has no appreciable vapor pressure at 20° C., and does not boil, at ordinary pressure, at 180° C. and below.

3. A method of making a semiconductor device having a p-n junction boundary region that emerges at a surface locality, comprising coating said emergent boundary region with a protective coating comprising a substance that is inherently electropositive in action when in place, said substance having a vapor pressure sufficiently low to remain stable and remain adsorbed over the range of temperatures to which the device is subjected when in operation, the substance having no appreciable vapor pressure at 20° C., and having a boiling point above that of water.

4. In a method of making a silicon semiconductor device having a p-n junction that emerges at the surface of the semiconductor, the improvement comprising applying a protective coating to the emergent p-n junction region of said surface, the coating comprising a mixture of a silicone resin and a phenolic resin, applied dissolved in an organic solvent.

5. In a method of making a silicon semiconductor device having a p-n junction that emerges at the surface of the semiconductor, the improvement comprising applying a protective coating to the emergent p-n junction region of said surface, the coating comprising a mixture of a silicone resin and a terephthal resin, applied dissolved in an organic solvent.

6. In a method of making a silicon semiconductor device having a p-n junction that emerges at the surface of the semiconductor, the improvement comprising applying a protective coating to the emergent p-n junction region of said surface, the coating comprising a mixture of a silicone resin and a phenolic resin, applied dissolved in an organic solvent, the coating further comprising a substance taken from the group consisting of alizarin, purpurin, tetra-hydroxy-quinone, and fluorescein.

7. In a method of making a silicon semiconductor device having a p-n junction that emerges at the surface of the semiconductor, the improvement comprising applying a protective coating to the emergent p-n junction region of said surface, the coating comprising a mixture of a silicone resin and a terephthal resin, applied dissolved in an organic solvent, the coating further comprising a substance taken from the group consisting of alizarin, purpurin, tetra-hydroxy-quinone, and fluorescein.

8. In a method of making an n-p-n transistor having at least two p-n junction boundary regions emerging at different surface localities, comprising applying, at the emergent p-n junction that is between the collector and base, a protective coating comprising a substance that is electropositive in action when in place, said substance having a vapor pressure sufficiently low to remain stable and remain adsorbed over the range of temperatures to which the device is subjected when in operation, the substance having no appreciable vapor pressure at 20° C., and having a boiling point above that of water.

9. In a method of making an n-p-n transistor having at least two p-n junction boundary regions emerging at different surface localities, comprising applying, at the emergent p-n junction that is between the collector and base, a protective coating comprising a substance that is electropositive in action when in place, and carrying out a tempering treatment at a temperature above room temperature, in a dry atmosphere, at the p-n junction between the emitter and base, until surface re-combination at the p-type area no longer declines, said substance having a vapor pressure sufficiently low to remain stable and remain adsorbed at the temperature of the tempering and during subsequent operation of the transistor, and has no appreciable vapor pressure at 20° C., and has a boiling point above that of water, the tempering and the applying of said coating, comprising an electropositive substance, being in either order.

10. The method of claim 9, the transistor being a silicon transistor, the tempering being at a temperature of at least about 180° C.

11. The method defined in claim 9, the production of the reduced rate of surface re-combination being limited to a surface portion of the entire semiconductor body, by preventing the tempering action from being effective at the other surface portions, this being carried out by previously depositing the said electropositively acting protective coating upon the other p-n junctions.

12. The method defined in claim 9, and further characterized in that, after the tempering treatment, the reduced rate of surface re-combination, produced also at the other p-n junctions, is compensated by the application of the electropositively acting protective coating.

13. A method of making a silicon semiconductor device having a p-n junction boundary region that emerges at a surface locality, comprising coating said locality with a varnish containing a substance taken from the group consisting of alizarin, purpurin, tetra-hydroxy-quinone, and fluorescein.

14. A method of making a silicon semiconductor device having a p-n junction boundary region that emerges at a surface locality, comprising coating said locality with a varnish containing a poly-hydroxy-phenyl compound having a melting point sufficiently high to remain solid at operationating temperatures and having a vapor pressure sufficiently low to remain stable and remain adsorbed at tempertures that occur during further manufacturing steps and during subsequent operation of the semiconductor device and imparting an electropositive action to the varnish when in the semiconductor.

15. A silicon semiconductor device having a p-n junction the boundary region of which emerges at the surface thereof, said boundary region being coated with a varnish containing a substance of the group consisting of alizarin, purpurin, tetra-hydroxy-quinone, and fluorescein.

16. A n-p-n silicon transistor device having two p-n junction boundary regions which emerge at surface localities thereof, the p-n boundary region located between the collector and base being coated with a varnish containing a substance of the group consisting of alizarin, purpurin, tetra-hydroxy-quinone, and fluorescein.

17. A n-p-n silicon transistor device having two p-n junction boundary regions which emerge at surface localities thereof, the p-n boundary region located between the emitter and base being coated with a substance taken from the group consisting of silicone resin and silicone high-vacuum grease, the p-n boundary region located between the collector and base being coated with a varnish containing a substance of the group consisting of alizarin purpurin, tetra-hydroxy-quinone, and fluorescein.

18. In a method of making a silicon semiconductor device having at least one p-n junction boundary region, which emerges at a surface locality, the emergent boundary being coated with an electrically insulating protective coating, the improvement which comprises using a varnish and alizarin as said coating.

19. In a method of making a silicon semiconductor device having at least one p-n junction boundary region, which emerges at a surface locality, the emergent boundary being coated with an electrically insulating protective coating, the improvement which comprises using a mixture of a varnish and 20% of alizarin by weight of varnish as said coating.

References Cited by the Examiner

UNITED STATES PATENTS

| | | | |
|---|---|---|---|
| 2,874,076 | 2/59 | Schwartz | 117—200 |
| 2,912,354 | 10/59 | Jung | 117—200 |
| 2,913,358 | 10/59 | Harrington et al. | 117—200 |
| 2,937,110 | 5/60 | John | 117—200 |

RICHARD D. NEVIUS, *Primary Examiner*.